US009171663B2

(12) United States Patent
Barry et al.

(10) Patent No.: US 9,171,663 B2
(45) Date of Patent: Oct. 27, 2015

(54) HIGH EFFICIENCY ON-CHIP 3D TRANSFORMER STRUCTURE

(71) Applicant: INTERNATIONAL BUSINESS MACHINES CORPORATION, Armonk, NY (US)

(72) Inventors: Robert L. Barry, Essex Junction, VT (US); Robert A. Groves, Highland, NY (US); Venkata Nr. Vanukuru, Bangalore (IN)

(73) Assignee: GLOBALFOUNDRIES U.S. 2 LLC, Grand Cayman (KY)

( * ) Notice: Subject to any disclaimer, the term of this patent is extended or adjusted under 35 U.S.C. 154(b) by 0 days.

(21) Appl. No.: 13/950,947

(22) Filed: Jul. 25, 2013

(65) Prior Publication Data

US 2015/0028987 A1 Jan. 29, 2015

(51) Int. Cl.
*H01F 5/00* (2006.01)
*H01F 27/28* (2006.01)
*H01L 27/08* (2006.01)

(52) U.S. Cl.
CPC .................................. *H01F 27/2804* (2013.01)

(58) Field of Classification Search
CPC .................... H01F 17/0013; H01F 2027/2809; H01F 38/14; H01F 17/0006
USPC ................... 336/170, 185, 192, 200; 257/531
See application file for complete search history.

(56) References Cited

U.S. PATENT DOCUMENTS

| | | | | |
|---|---|---|---|---|
| 4,613,843 | A * | 9/1986 | Esper et al. | 336/232 |
| 5,852,866 | A | 12/1998 | Kuettner et al. | |
| 6,054,914 | A | 4/2000 | Abel et al. | |
| 6,198,374 | B1 | 3/2001 | Abel | |
| 6,707,367 | B2 | 3/2004 | Castaneda et al. | |
| 6,714,112 | B2 | 3/2004 | Beng et al. | |
| 6,717,502 | B2 * | 4/2004 | Yue | 336/200 |
| 6,841,847 | B2 | 1/2005 | Sia et al. | |
| 6,879,234 | B2 * | 4/2005 | Furumiya et al. | 336/200 |
| 6,940,386 | B2 | 9/2005 | Mukherjee et al. | |

(Continued)

FOREIGN PATENT DOCUMENTS

| | | | |
|---|---|---|---|
| CN | 202373582 | U | 8/2012 |
| EP | 0725407 | A1 | 8/1996 |

OTHER PUBLICATIONS

Chiou, H., et al. "Broadband and Low-Loss 1:9 Transmission-Line Transformer in 0.18-um CMOS Process" IEEE Electron Device Letters, vol. 31, Issue. 9. Sep. 2010. pp. 921-923.

(Continued)

*Primary Examiner* — Alexander Talpalatski
*Assistant Examiner* — Joselito Baisa
(74) *Attorney, Agent, or Firm* — Tutunjian & Bitetto, P.C.

(57) ABSTRACT

An integrated circuit transformer structure includes at least two conductor groups stacked in parallel in different layers. A first spiral track is formed in the at least two conductor groups, the first spiral track includes first turns of a first radius within each of the at least two conductor groups, and second turns of a second radius within each of the at least two conductor groups, the first and second turns being electrically connected. A second spiral track is formed in the at least two conductor groups, the second spiral track including a plurality of adjacent turns of one or more radii within each of the at least two conductor groups and disposed in a same plane between the first and second turns in each of the at least two conductor groups.

11 Claims, 18 Drawing Sheets

(56) References Cited

U.S. PATENT DOCUMENTS

| | | | | |
|---|---|---|---|---|
| 6,959,482 | B2 * | 11/2005 | Liang et al. | 29/602.1 |
| 7,283,029 | B2 | 10/2007 | Weon et al. | |
| 7,370,403 | B1 * | 5/2008 | Hsu et al. | 29/602.1 |
| 7,405,642 | B1 | 7/2008 | Hsu et al. | |
| 7,570,144 | B2 | 8/2009 | Lim et al. | |
| 7,671,714 | B2 * | 3/2010 | Tiemeijer | 336/200 |
| 7,705,704 | B2 | 4/2010 | Lee et al. | |
| 7,755,292 | B1 * | 7/2010 | Tuma et al. | 313/631 |
| 7,808,356 | B2 | 10/2010 | Papananos | |
| 7,952,458 | B2 | 5/2011 | Ezzeddine | |
| 8,068,003 | B2 * | 11/2011 | Chen et al. | 336/200 |
| 8,081,056 | B2 * | 12/2011 | Lee et al. | 336/222 |
| 8,334,747 | B2 | 12/2012 | Matsumoto | |
| 8,786,393 | B1 | 7/2014 | Chen | |
| 2004/0021227 | A1 | 2/2004 | Watanabe | |
| 2006/0087384 | A1 | 4/2006 | Ezzendine | |
| 2007/0296519 | A1 | 12/2007 | Ezzeddine et al. | |
| 2008/0218300 | A1 | 9/2008 | Loef et al. | |
| 2008/0272875 | A1 | 11/2008 | Huang et al. | |
| 2009/0153260 | A1 | 6/2009 | Rofougaran | |
| 2009/0284339 | A1 | 11/2009 | Choi et al. | |
| 2010/0225400 | A1 | 9/2010 | Rofougaran et al. | |
| 2011/0032065 | A1 | 2/2011 | Raczkowski | |
| 2011/0316657 | A1 | 12/2011 | Park et al. | |
| 2012/0056297 | A1 | 3/2012 | Akhtar et al. | |
| 2012/0056680 | A1 | 3/2012 | Kim et al. | |
| 2012/0248978 | A1 | 10/2012 | Howald et al. | |

OTHER PUBLICATIONS

Fong, N., et al. "High-Performance and Area-Efficient Stacked Transformers for RF CMOS Integrated Circuits" 2003 IEEE MTT-S International Microwave Symposium Digest, vol. 2. Jun. 2003. pp. 967-970.

Hsu, F., et al. "Design of On-Chip Transformer With Various Coil Widths to Achieve Minimal Metal Resistance" IEEE Electron Device Letters, vol. 28, No. 11. Nov. 2007. pp. 1029-1032.

Hsu, F., et al. "Layout Design of On-Chip Transformer With Uniform Variation of Coil Widths" European Microwave Conference. EuMC 2009. Sep. 2009. pp. 1199-1202.

Ito, T., et al. "Characterization of On-Chip Multiport Inductors for Small-Area RF Circuits" IEEE Transactions on Circuits and Systems—I: Regular Papers, vol. 56, No. 8. Aug. 2009. pp. 1590-1597.

Kim, J., et al. "High-Performance Three-Dimensional On-Chip Inductors in SOI CMOS Technology for Monolithic RF Circuit Applications" 2003 IEEE Radio Frequency Integrated Circuits Symposium. Jun. 2003. pp. 591-594.

Leite, B., et al. "Design and Characterization of CMOS Millimeter-Wave Transformers" 2009 SBMO/IEEE MTT-S International Wave and Optoelectronics Conference (IMOC). Nov. 2009. pp. 402-406.

Lim, C., et al. "An Area Efficient High Turn Ratio Monolithic Transformer for Silicon RFIC" 2008 IEEE radio Frequency Integrated Circuits Symposium. Apr. 2008. pp. 167-170.

Lim, S., et al. "Extremely High-Q Stacked Transformer-Type Inductors for RF Applications" 2003 International Symposium on VLSI Technology, Systems, and Applications. Oct. 2003. pp. 147-150.

Lopez-Villegas, J., et al. "Improvement of the Quality Factor of RF Integrated Inductors by Layout Optimization" IEEE Transactions on Microwave Theory and Techniques, vol. 48, No. 1. Jan. 2000. pp. 76-83.

Park, J., et al. "Monolithically Integrated 3-D Micro-Inductors and Micro-Transformers for RF Applications" 8th International Symposium on Advanced Packaging Materials. Mar. 2002. pp. 362-363.

Weon, D. "High-Q Integrated 3-D Inductors and Transformers for High Frequency Applications" 2004 IEEE MTT-S International Microwave Symposium Digest, vol. 2. Jun. 2004. pp. 877-880.

Wu, C., et al. "Analysis and Application of Miniature 3D Inductor" ISCAS 2002. IEEE International Symposium on Circuits and Systems, vol. 2. May 2002. pp. 811-814.

Young, D., et al. "Monolithic High-Performance Three-Dimensional Coil Inductors for Wireless Communication Applications" International Electron Devices Meeting (IEDM '97)—Technical Digest. Dec. 1997. pp. 67-70.

Yousef, K., et al. "Design of 3D Integrated Inductors for RFICS" 2012 Japan-Egypt Conference on Electronics, Communications and Computers (JEC-ECC). Mar. 2012. pp. 22-25.

Zolfaghari, A., et al. "Stacked Inductors and Transformers in CMOS Technology" IEEE Journal of Solid-State Circuits, vol. 36, No. 4. Apr. 2001. pp. 620-628.

Barry, R., et al. "Folder Conical Inductor" U.S. Appl. No. 13/654,529, filed Oct. 18, 2012. (86 Pages).

Weon, D. "High-Q Three-Dimensional Inductors and Transformers for High Frequency Applications" Dissertation No. AAI3287260 for Purdue University. 2007 (Abstract Only).

Non-Final Office Action issued in U.S. Appl. No. 13/950,027 on Oct. 6, 2014. (15 Pages).

Office Action for U.S. Appl. No. 13/950,557 mailed on Feb. 18, 2015.

Office Action for U.S. Appl. No. 13/950,008 dated Apr. 8, 2015.

Office Action for U.S. Appl. No. 13/950,557 mailed on Aug. 6, 2015.

* cited by examiner

180

HIGH EFFICIENCY ON-CHIP 3D TRANSFORMER STRUCTURE

RELATED APPLICATION DATA

This application is related to commonly assigned application Ser. No. 13/950,027, Ser. No. 13/950,008, and Ser. No. 13/950,557, all filed concurrently herewith, and all incorporated herein by reference.

BACKGROUND

1. Technical Field

The present invention relates to integrated circuits, and more particularly to three-dimensional integrated circuit transformer structures configured for variable turns ratios for use with high frequency applications.

2. Description of the Related Art

With an increased demand for personal mobile communications, integrated semiconductor devices such as complementary metal oxide semiconductor (CMOS) devices may, for example, include voltage controlled oscillators (VCO), low noise amplifiers (LNA), tuned radio receiver circuits, or power amplifiers (PA). Each of these tuned radio receiver circuits, VCO, LNA, and PA circuits may, however, require on-chip inductor components in their circuit designs.

Several design considerations associated with forming on-chip inductor components may, for example, include quality factor (i.e., Q-factor), self-resonance frequency ($f_{SR}$), and cost considerations impacted by the area occupied by the formed on-chip inductor. Accordingly, for example, a CMOS radio frequency (RF) circuit design may benefit from, among other things, one or more on-chip inductors having a high Q-factor, a small occupied chip area, and a high $f_{SR}$ value. The self-resonance frequency ($f_{SR}$) of an inductor may be given by the following equation:

$$f_{SR} = \frac{1}{2\pi\sqrt{LC}},$$

where L is the inductance value of the inductor and C may be the capacitance value associated with the inductor coil's inter-winding capacitance, the inductor coil's interlayer capacitance, and the inductor coil's ground plane (i.e., chip substrate) to coil capacitance. From the above relationship, a reduction in capacitance C may desirably increase the self-resonance frequency ($f_{SR}$) of an inductor. One method of reducing the coil's ground plane to coil capacitance (i.e., metal to substrate capacitance) and, therefore, C value, is by using a high-resistivity semiconductor substrate such as a silicon-on-insulator (SOI) substrate. By having a high resistivity substrate (e.g., >50 Ω-cm), the effect of the coil's metal (i.e., coil tracks) to substrate capacitance is diminished, which in turn may increase the self-resonance frequency ($f_{SR}$) of the inductor.

The Q-factor of an inductor may be given by the equation:

$$Q = \frac{\omega L}{R},$$

where ω is the angular frequency, L is the inductance value of the inductor, and R is the resistance of the coil. As deduced from the above relationship, a reduction in coil resistance may lead to a desirable increase in the inductor's Q-factor. For example, in an on-chip inductor, by increasing the turn-width (i.e., coil track width) of the coil, R may be reduced in favor of increasing the inductors Q-factor to a desired value. In radio communication applications, the Q-factor value is set to the operating frequency of the communication circuit. For example, if a radio receiver is required to operate at 2 GHz, the performance of the receiver circuit may be optimized by designing the inductor to have a peak Q frequency value of about 2 GHz. The self-resonance frequency ($f_{SR}$) and Q-factor of an inductor are directly related in the sense that by increasing $f_{SR}$, peak Q is also increased.

On-chip transformers are formed from inductor-like structures. On-chip transformers are needed in radio frequency (RF) circuits for a number of functions including impedance transformation, differential to single conversion and vice versa (balun), DC isolation and bandwidth enhancement to name a few. Some performance metrics of on-chip transformers may include a coefficient of coupling (K), occupied area, impedance transformation factor (turns ratio), power gain, insertion loss, efficiency and power handling capability.

SUMMARY

An integrated circuit transformer structure includes at least two conductor groups stacked in parallel in different layers. A first spiral track is formed in the at least two conductor groups, the first spiral track includes first turns of a first radius within each of the at least two conductor groups, and second turns of a second radius within each of the at least two conductor groups, the first and second turns being electrically connected. A second spiral track is formed in the at least two conductor groups, the second spiral track including a plurality of adjacent turns of one or more radii within each of the at least two conductor groups and disposed in a same plane between the first and second turns in each of the at least two conductor groups.

Another integrated circuit transformer structure includes at least two conductor groups, each conductor group forming a spiral, the spirals of the at least two conductor groups being stacked in parallel in different layers. The spirals include turns of a first radius connected in series between the layers to form a first cylinder of turns within the at least two conductor groups, turns of a second radius connected in series between the layers to form a second cylinder of turns within the at least two conductor groups and turns of a third radius connected in series between the layers to form a third cylinder of turns within the at least two conductor groups, wherein the first and the third cylinder are electrically connected to each other and electrically isolated from the second cylinder, the second cylinder including a plurality of adjacent turns of one or more radii in each of the at least two conductor groups and disposed in a same plane between turns of the first and third cylinders in each of the at least two conductor groups.

A transformer structure includes at least two conductor groups, each conductor group forming a spiral, the spirals of the at least two conductor groups being stacked in parallel in different layers. A first spiral track includes first sets of turns of one or more radii in all the different layers, the first sets of turns of one or more radii being connected in series between the layers. A second spiral track includes second sets of turns of one or more radii in all the different layers, connected in series between the layers such that second sets of turns are disposed between first sets of turns within each plane of the layers in an alternating pattern and all first sets of turns are electrically connected and all second sets of turns are electrically connected.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
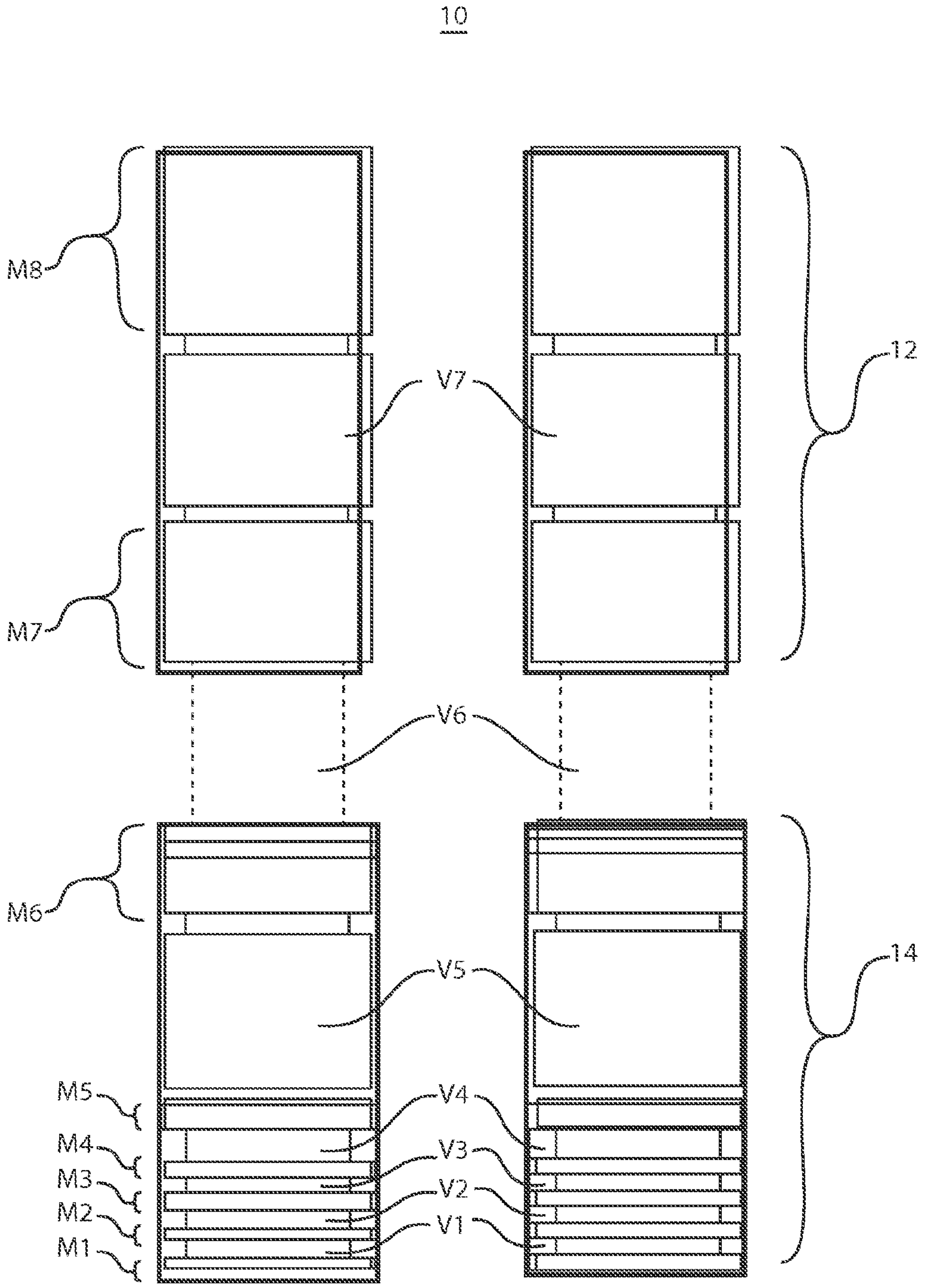
FIG. 1 is a cross-sectional view showing metal layer connected by vias to form conductor groups in accordance with one embodiment.

In accordance with the present principles, transformer structures are described that provide reduced occupied area, provide a variable turns ratio and provide higher efficiency. The transformer structures are integrated into metal layers of an integrated circuit device. In useful embodiments, three-dimensional (3D) transformer structures include a primary (primary coil) and a secondary (secondary coil), which are composed of vertically solenoidal series wound spirals. These spirals are in turn realized using at least two or more parallel stacked metals. Both the primary and secondary are interleaved. The spirals traverse through different turns accomplished by breaking open the spiral without disturbing the current flow. This can be achieved due to the parallel stacking of the at least two metals. In one embodiment, the primary coil and the secondary coil each comprise at least two metal layers stacked in parallel.

The present embodiments find utility in any device that includes or needs a transformer and, in particularly useful embodiments, the present principles provide transformers for high frequency applications such as communications applications, e.g., in GSM and CDMA frequency bands, amplifiers, power transfer devices, etc.

It is to be understood that the present invention will be described in terms of a given illustrative architecture formed on a wafer and integrated into a solid state device or chip; however, other architectures, structures, materials and process features and steps may be varied within the scope of the present invention. The terms coils, inductors and windings may be employed interchangeably throughout the disclosure. It should also be understood that these structures may take on any useful shape including rectangular, circular, oval, square, polygonal, etc.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a semiconductor device 10 is shown in accordance with the present principles to define structural concepts. The cross-sectional view cuts through coils in different metal layers M1, M2, M3, M4, M5, M6, M7 and M8 of the semiconductor device 10. The metal layers M1-M6 are connected by vias V1, V2, V3, V4 and V5, and metal layers M7 and M8 are connected by vias V7. Via layer V6 is open two create two conductor groups 12 and 14. The conductor group 12 includes metal layers M7 and M8 electrically connected in parallel by vias V7, and conductor group 14 includes metal layers M1-M6 electrically connected in parallel by vias V1, V2, V3, V4 and V5. The metal layers may correspond to the back end of the line (BEOL) region of a semiconductor device.

Figure 2:
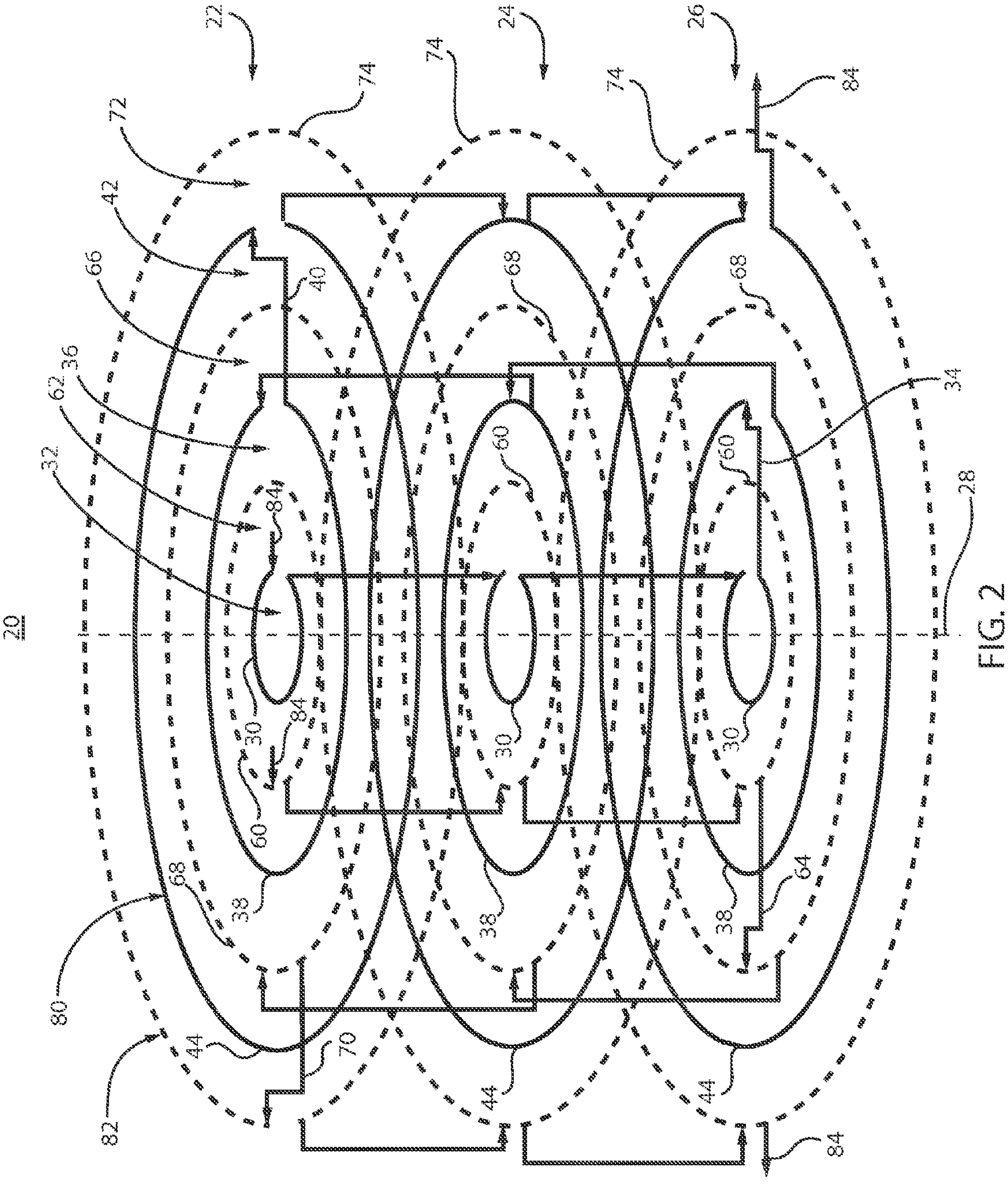
FIG. 2 is a three-dimensional schematic diagram of a transformer structure showing two spiral tracks connected through three levels in accordance with one embodiment.

Referring to FIG. 2, a transformer structure 20 is shown formed with three conductor groups 22, 24, and 26 in accordance with one illustrative embodiment. Each conductor group may include one or more individual metal layers (e.g., M1, M2, etc.). If more than one metal layer is included in the conductor group then metal layers may be parallel connected using vias. The conductor groups 22, 24 and 26 are preferably concentrically formed on a central axis or centerline 28.

The structure 20 includes turns 30 connected to each other on a first cylinder 32 having a first radius. The turns 30 are vertically disposed in each conductor group 22, 24 and 26 and collectively form the first cylinder 32. A connection 34 is made to a second cylinder 36, which is formed of turns 38 having a second radius. Turns 38 are electrically connected to one another. A connection 40 is made to a third cylinder 42, which is formed of turns 44 having a third radius. Turns 44 are electrically connected to one another. Cylinders 32, 36 and 42 form a first coil 80 (solid line spiral track) of the structure 20.

The structure 20 includes turns 60 connected to each other on a fourth cylinder 62 having a fourth radius. The turns 60 are vertically disposed in each conductor group 22, 24 and 26 and collectively form the fourth cylinder 62, as before. A connection 64 is made to a fifth cylinder 66, which is formed of turns 68 having a fifth radius. Turns 68 are electrically connected to one another. A connection 70 is made to a sixth cylinder 72, which is formed of turns 74 having a sixth radius. Turns 74 are electrically connected to one another. Cylinders 62, 66 and 72 form a second coil 82 (dashed line spiral track) of the structure 20. Inputs and outputs 84 are designated as arrows 84. Connections between turns are shown as vertically disposed arrows and are not individually labeled for ease of viewing.

The first and second coils 80, 82 may include a primary coil and secondary coil (or vice versa) for a transformer. The transformer may include two or more spiral tracks (two are shown in FIG. 2). Each spiral track includes two or more turns, and each turn is created within a single conductor group. Each conductor group includes one or more individual metal layers. In turns comprised of conductor groups having more than one layer the "individual metal layers" within the turn's conductor group are connected together electrically in parallel using vias, and the "individual metal layers" within the turn's conductor group all have a same shape (turn width, turn to turn space, diameter) and are in alignment with each other on the high frequency transformer's axial centerline.

Each spiral track's turns are preferably connected together in such a way that capacitance between turns within the spiral track is minimized, and magnetic field coupling between turns in the spiral track is maximized. The two or more spiral tracks (coils) are placed in close proximity with each other in such a way that magnetic field coupling between the spiral tracks is maximized. The number of turns in each spiral track can be defined in such a way as to achieve different "turns ratios" among the spiral tracks ("1:1", "Variable", etc.). In some embodiments, this is achieved by solenoidal, interleaved primary and secondary coils. The interleaving includes building cylinders from turns on different metal layers or in different conductor groups such that an inner cylinder is encapsulated by a middle cylinder which is encapsulated by an outer cylinder. The inner and outer cylinders are electrically connected to each other.

The embodiments described herein maximize inductance per unit area in both primary and secondary coils by providing the nested or concentric cylinder designs described herein. Advantages include higher inductance in the same area so that higher primary and secondary impedance can be achieved. In addition, a smaller area is provided for the same inductance so that lower capacitance and lower loss are achieved.

Figure 3:
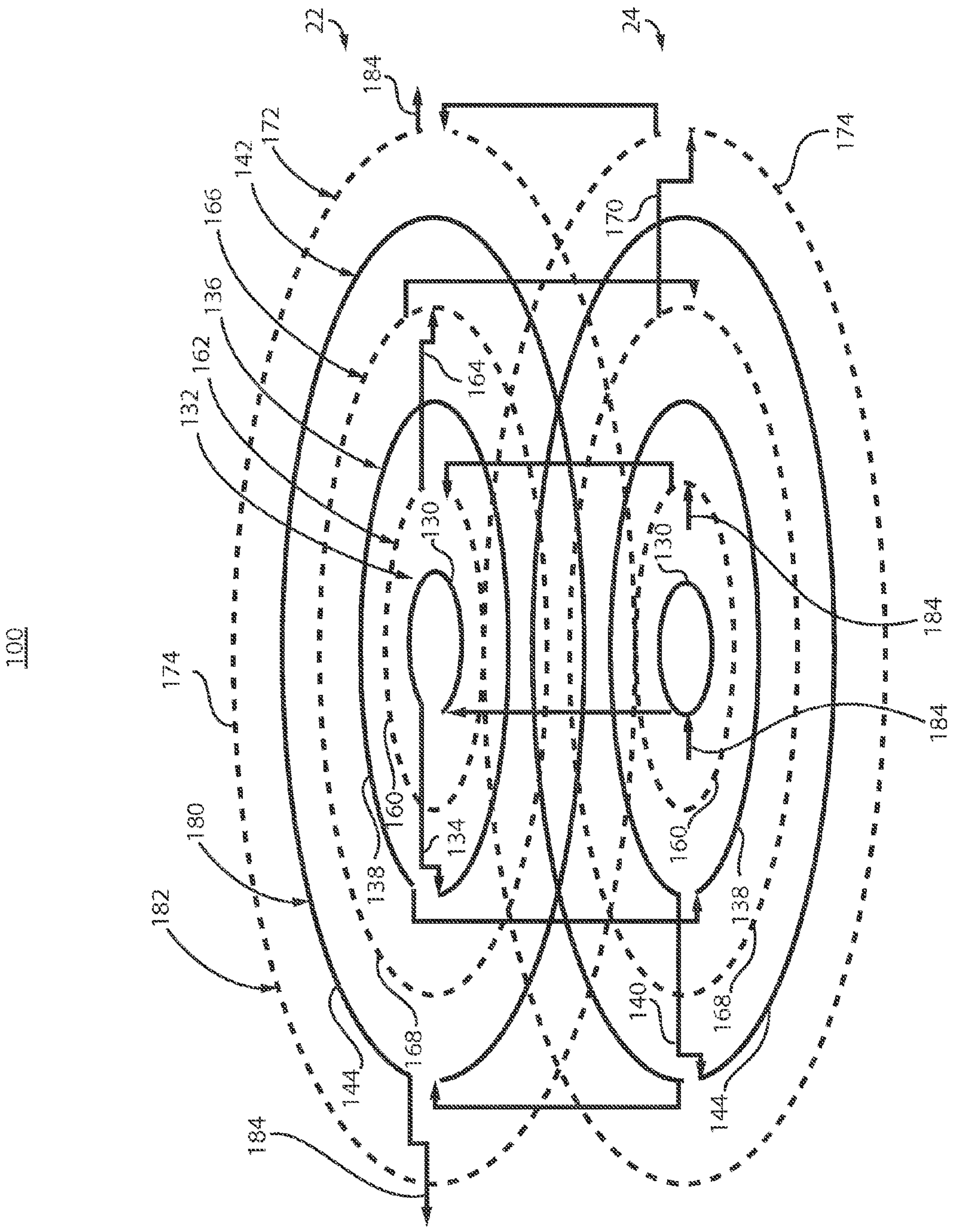
FIG. 3 is a three-dimensional schematic diagram of a transformer structure showing two spiral tracks connected through two levels in accordance with one embodiment.

Referring to FIG. 3, a transformer structure 100 is shown formed with two conductor groups 22 and 24 in accordance with another illustrative embodiment. Each conductor group may include one or more individual metal layers (e.g., M1, M2, etc.). If more than one metal layer is included in the conductor group then metal layers may be parallel connected using vias. The conductor groups 22 and 24 are preferably concentrically formed on a central axis or centerline (not shown).

The structure 100 includes turns 130 connected to each other on a first cylinder 132 having a first radius. The turns 130 are vertically disposed in each conductor group 22 and 24 and collectively form the first cylinder 132. A connection 134 is made to a second cylinder 136, which is formed of turns 138 having a second radius. Turns 138 are electrically connected to one another. A connection 140 is made to a third cylinder 142, which is formed of turns 144 having a third radius. Turns 144 are electrically connected to one another. Cylinders 132, 136 and 142 form a first coil 180 (solid line spiral track) of the structure 100.

The structure 100 includes turns 160 connected to each other on a fourth cylinder 162 having a fourth radius. The turns 160 are vertically disposed in each conductor group 22 and 24 and collectively form the fourth cylinder 162, as before. A connection 164 is made to a fifth cylinder 166, which is formed of turns 168 having a fifth radius. Turns 168 are electrically connected to one another. A connection 170 is made to a sixth cylinder 172, which is formed of turns 174 having a sixth radius. Turns 174 are electrically connected to one another. Cylinders 162, 166 and 172 form a second coil 182 (dashed line spiral track) of the structure 100. Inputs and outputs 184 are designated as arrows 184. Connections between turns are shown as vertically disposed arrows and are not individually labeled for ease of viewing.

The first and second coils 180, 182 may include a primary coil and secondary coil (or vice versa) for a transformer. The transformer may include two or more spiral tracks (two are shown in FIG. 3). Each spiral track includes two or more turns, and each turn is created within a single conductor group. Each conductor group includes one or more individual metal layers. In turns comprised of conductor groups having more than one layer the "individual metal layers" within the turn's conductor group are connected together electrically in parallel using vias, and the "individual metal layers" within the turn's conductor group all have a same shape (turn width, turn to turn space, diameter) and are in alignment with each other on the high frequency transformer's axial centerline.

Each spiral track's turns are preferably connected together in such a way that capacitance between turns within the spiral track is minimized, and magnetic field coupling between turns in the spiral track is maximized. The two or more spiral tracks (coils) are placed in close proximity with each other in such a way that magnetic field coupling between the spiral tracks is maximized. The number of turns in each spiral track can be defined in such a way as to achieve different "turns ratios" among the spiral tracks ("1:1", "Variable", etc.). In some embodiments, this is achieved by solenoidal, interleaved primary and secondary coils. The interleaving includes building cylinders from turns on different metal layers or in different conductor groups such that an inner cylinder is encapsulated by a middle cylinder which is encapsulated by an outer cylinder. The inner and outer cylinders are electrically connected to each other.

To better understand the structure 100. FIGS. 4-9 show cylinders of turns being formed for each spiral trace (coil). While FIGS. 4-9 show the decomposition of the transformer structure for a two layer design, the same deconstruction can be applied to the three or more layers (see e.g., FIG. 2).

Referring to FIGS. 4-9, a structure including two or more conductor groups has a first spiral track that begins with a turn at the inner radius on the first conductor group followed by a turn at the same radius on the second conductor group, continuing upward (or downward) until all conductor groups have been traversed with a final turn being on a final conductor group. A next turn occurs at a radius of the inner radius plus two radius increments also on the final conductor group followed by a turn at the same radius on the next conductor group down (or up), continuing downward until all conductor groups have been traversed with the final turn being on the first conductor group the process continues until the desired number of turns have been achieved. A second spiral track begins with a turn at the inner radius plus one radius increment on the first conductor group followed by a turn at the same radius on the second conductor group, continuing upward until all conductor groups have been traversed with the final turn being on the final conductor group next turn occurs at a radius of the inner radius plus three radius increments, also on the final conductor group, followed by a turn at the same radius on the next conductor group down, continuing downward until all conductor groups have been traversed with the final turn being on the first conductor group the process continues until the desired number of turns have been achieved.

Figure 4:
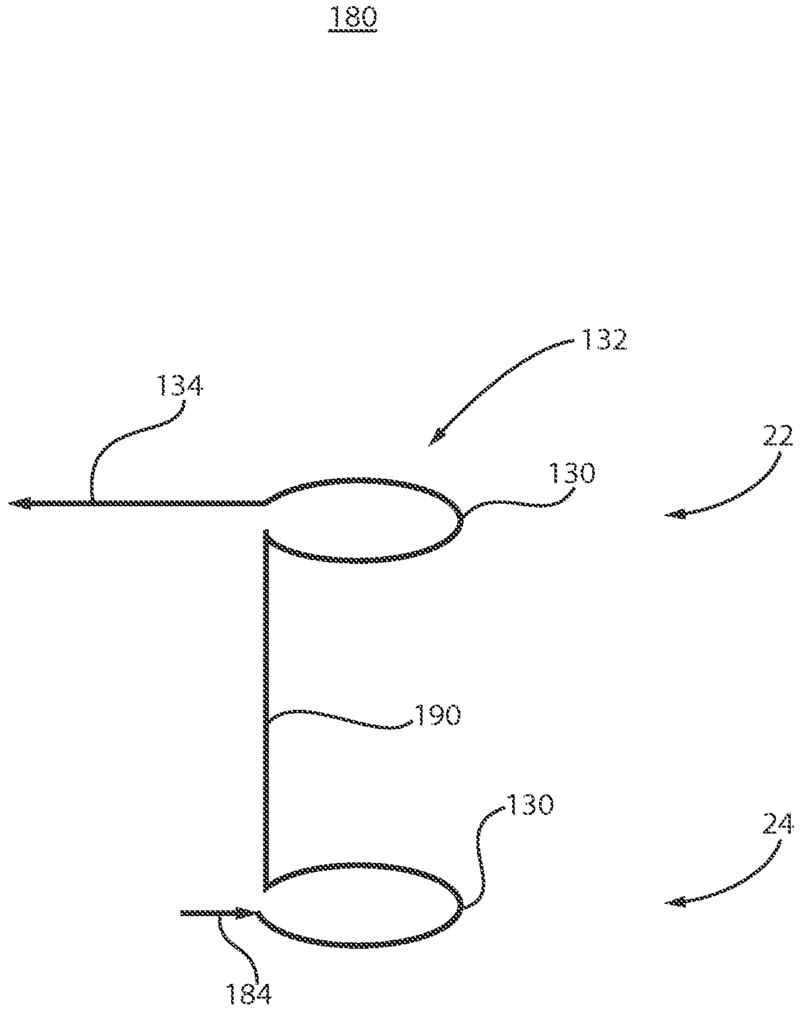
FIG. 4 is a decomposition of the transformer structure of FIG. 3 showing turns forming a first cylinder of a first spiral track in accordance with an illustrative embodiment.

Referring to FIG. 4, the first cylinder 132 is formed by two turns 130 in different metal layers or conductor groups 22, 24. A vertical connection (via) 190 electrically connects the turns 130 to each other. The connection 134 will connect the turns 130 of cylinder 132 to another cylinder 136 of the same coil 180.

Figure 5:
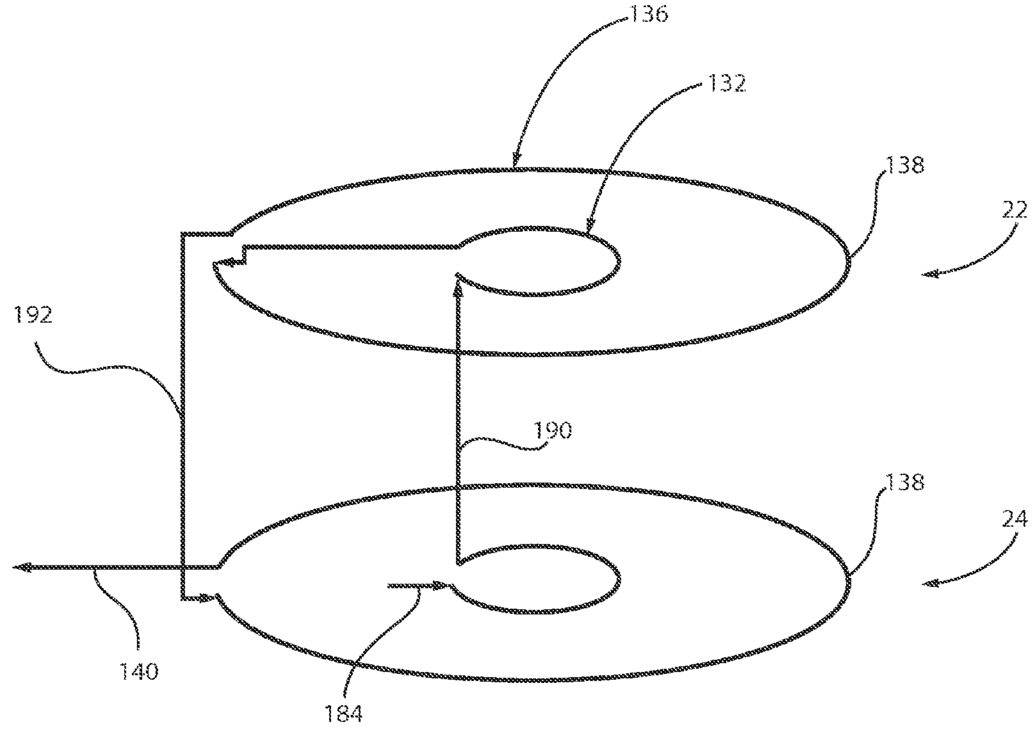
FIG. 5 is a decomposition of the transformer structure of FIG. 3 showing turns forming a second cylinder of the first spiral track connected to the first cylinder in accordance with the illustrative embodiment.

Referring to FIG. 5, the cylinder 136 is formed by two turns 138 in different metal layers or conductor groups 22, 24. A vertical connection (via) 192 electrically connects the turns 138 to each other. The connection 140 will connect the turns 138 of cylinder 136 to another cylinder 142 of the same coil 180. A distance between the turns 138 and 132 is sufficient to permit turns 160 of cylinder 162 to be disposed therebetween (see FIG. 7).

Figure 6:
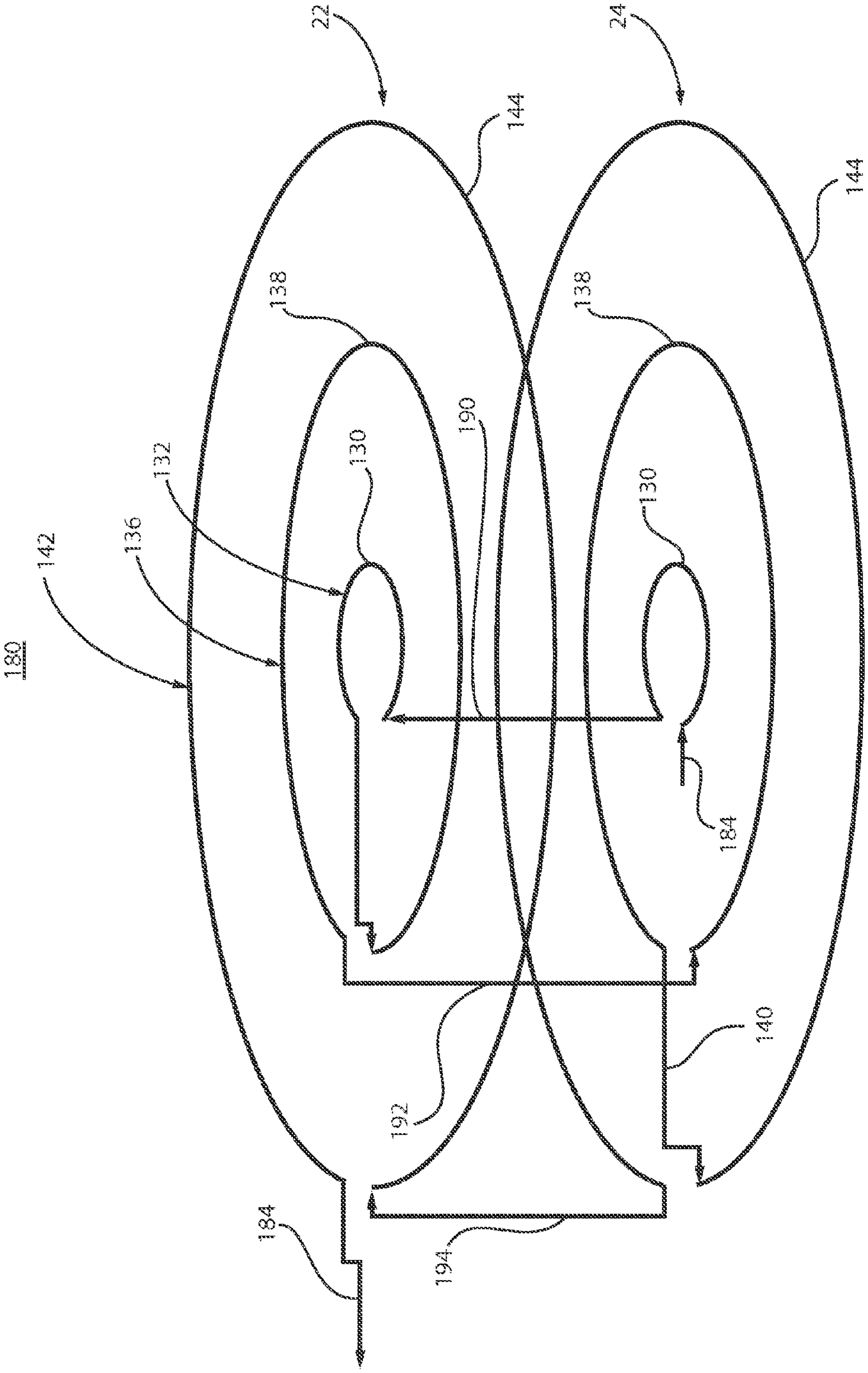
FIG. 6 is a decomposition of the transformer structure of FIG. 3 showing turns forming a third cylinder of the first spiral track connected to the first and second cylinders in accordance with the illustrative embodiment.

Referring to FIG. 6, the cylinder 142 is formed by two turns 144 in different metal layers or conductor groups 22, 24. A vertical connection (via) 194 electrically connects the turns 144 to each other. The connection 140 connects the turns 138 of cylinder 136 to turns 144 of cylinder 142 of the same coil 180. A distance between the turns 138 and 144 is sufficient to permit turns 168 of cylinder 166 to be disposed therebetween (see FIG. 8). It should be understood that additional cylinders may be formed other than the illustrative number of cylinders shown in this example.

Figure 7:
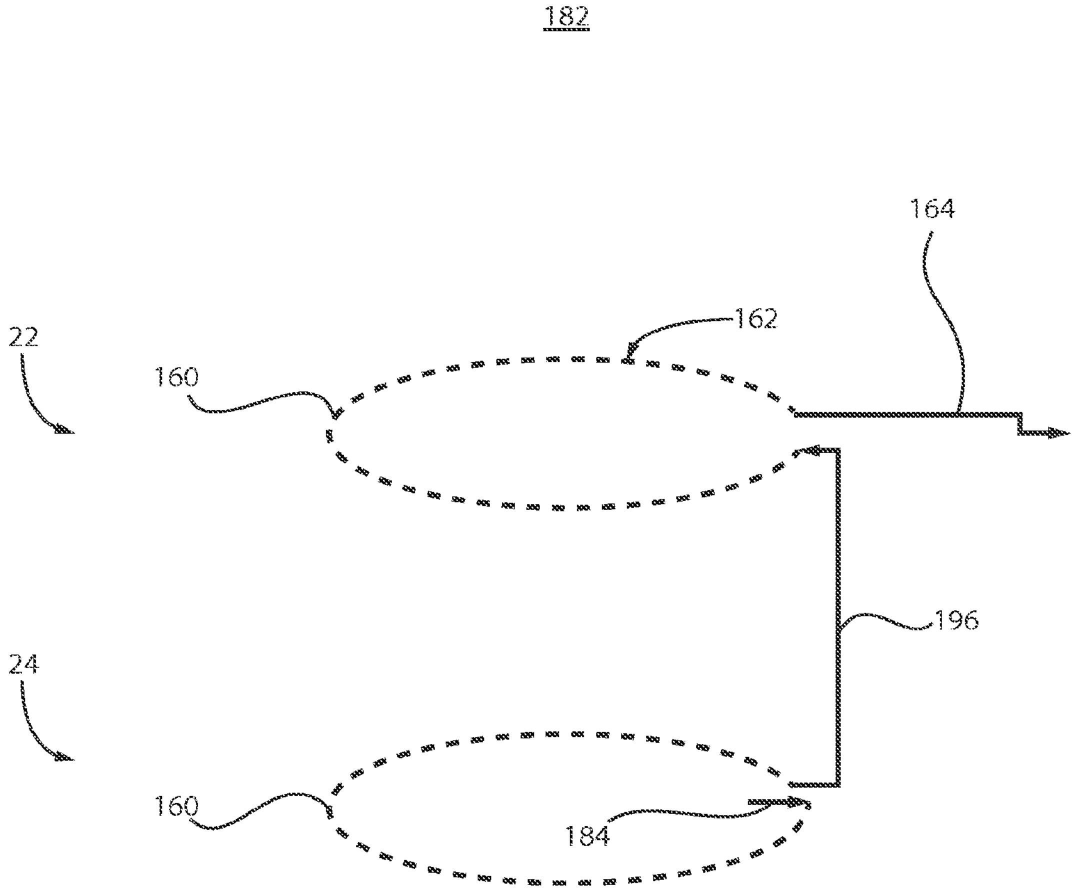
FIG. 7 is a decomposition of the transformer structure of FIG. 3 showing turns forming a fourth cylinder of a second spiral track in accordance with the illustrative embodiment.

Referring to FIG. 7, the cylinder 162 is formed by two turns 160 in different metal layers or conductor groups 22, 24. A vertical connection (via) 196 electrically connects the turns 160 to each other. The connection 164 will connect the turns 160 of cylinder 162 to another cylinder 166 of the same coil 182. Cylinder 162 is disposed between the cylinders 132 and 136 as shown in FIG. 3.

Figure 8:
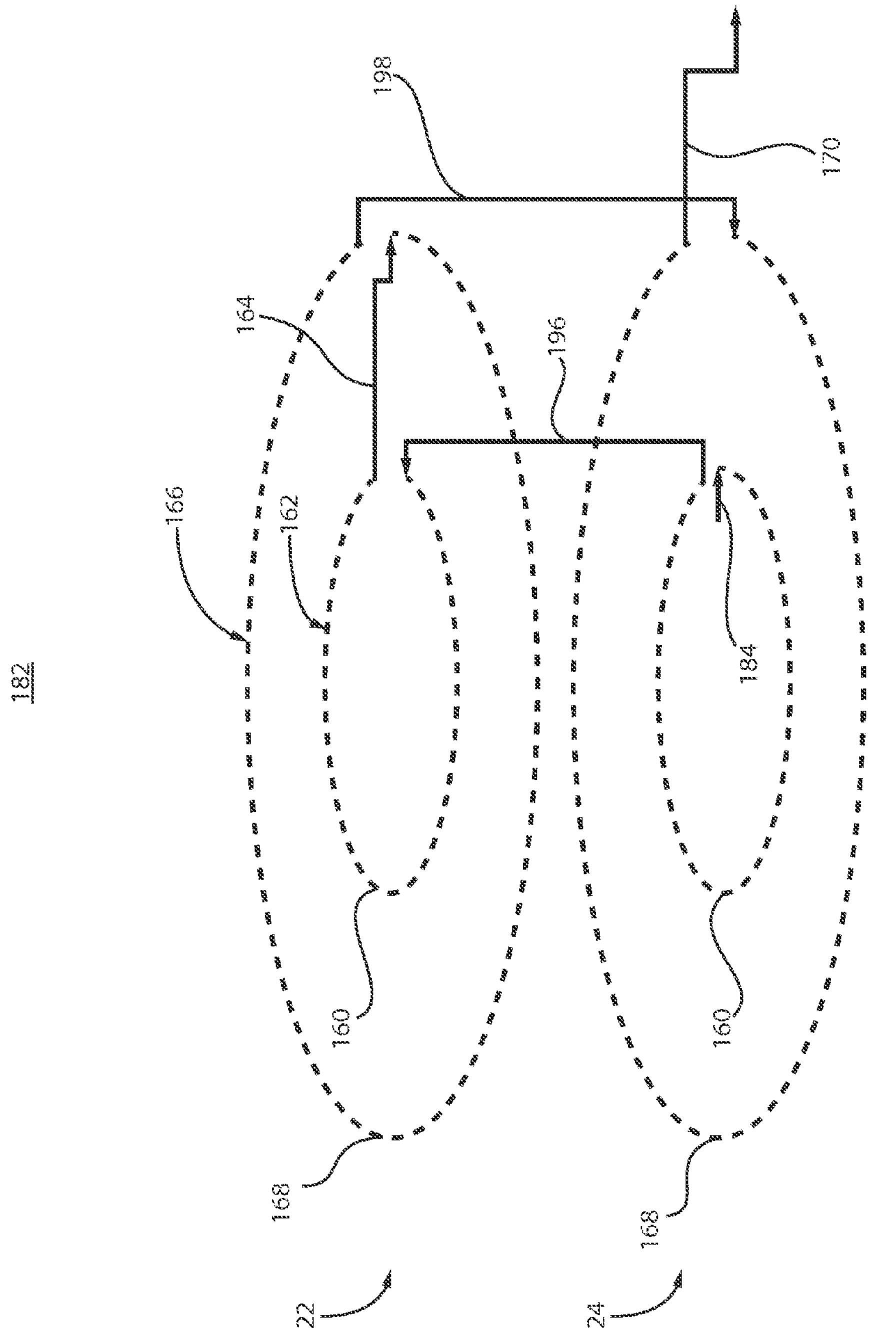
FIG. 8 is a decomposition of the transformer structure of FIG. 3 showing turns forming a fifth cylinder of the second spiral track connected to the fourth cylinder in accordance with the illustrative embodiment.

Referring to FIG. 8, the cylinder 166 is formed by two turns 168 in different metal layers or conductor groups 22, 24. A vertical connection (via) 198 electrically connects the turns 168 to each other. The connection 170 will connect the turns 168 of cylinder 166 to another cylinder 172 of the same coil 182. A distance between the turns 168 and 162 is sufficient to permit turns 138 of cylinder 136 to be disposed therebetween (see FIG. 5).

Figure 9:
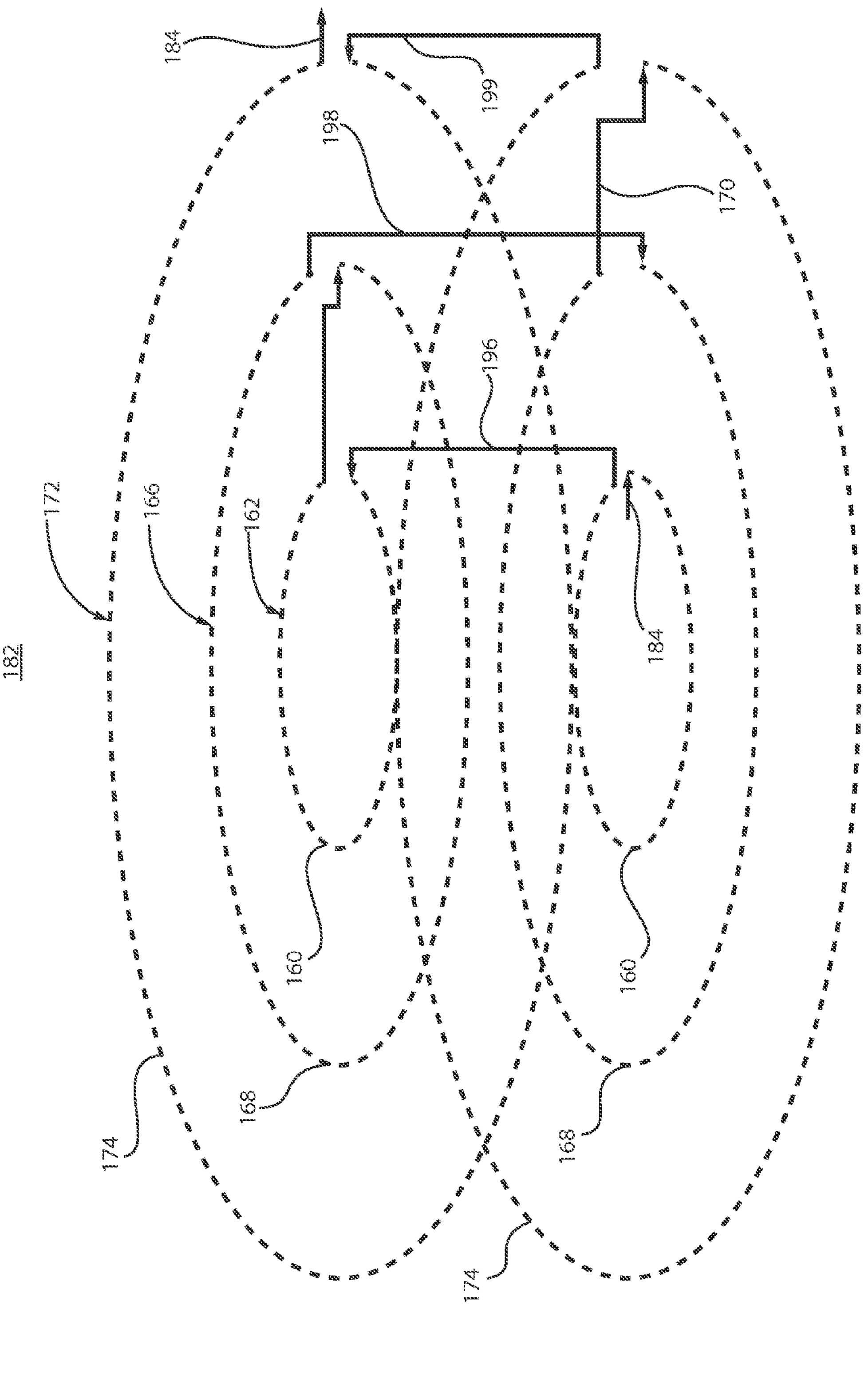
FIG. 9 is a decomposition of the transformer structure of FIG. 3 showing turns forming a sixth cylinder of the second spiral track connected to the fourth and fifth cylinders in accordance with the illustrative embodiment.

Referring to FIG. 9, the cylinder 172 is formed by two turns 174 in different metal layers or conductor groups 22, 24. A vertical connection (via) 199 electrically connects the turns 174 to each other. The connection 170 connects the turns 168 of cylinder 166 to turns 174 of cylinder 172 of the same coil 182. A distance between the turns 168 and 174 is sufficient to permit turns 144 of cylinder 142 to be disposed therebetween (see FIG. 6). It should be understood that additional cylinders may be formed other than the illustrative number of cylinders shown in this example. Combining the coil 180 of FIG. 6 with the coil 182 of FIG. 9 provides the transformer structure 100 of FIG. 3. The coils 180 and 182 can be thought of as nested cylinders with walls alternatingly connected between two coils. The coils include turns and the walls of the cylinders may include a single turn thickness or multiple turn thicknesses.

Figure 10:
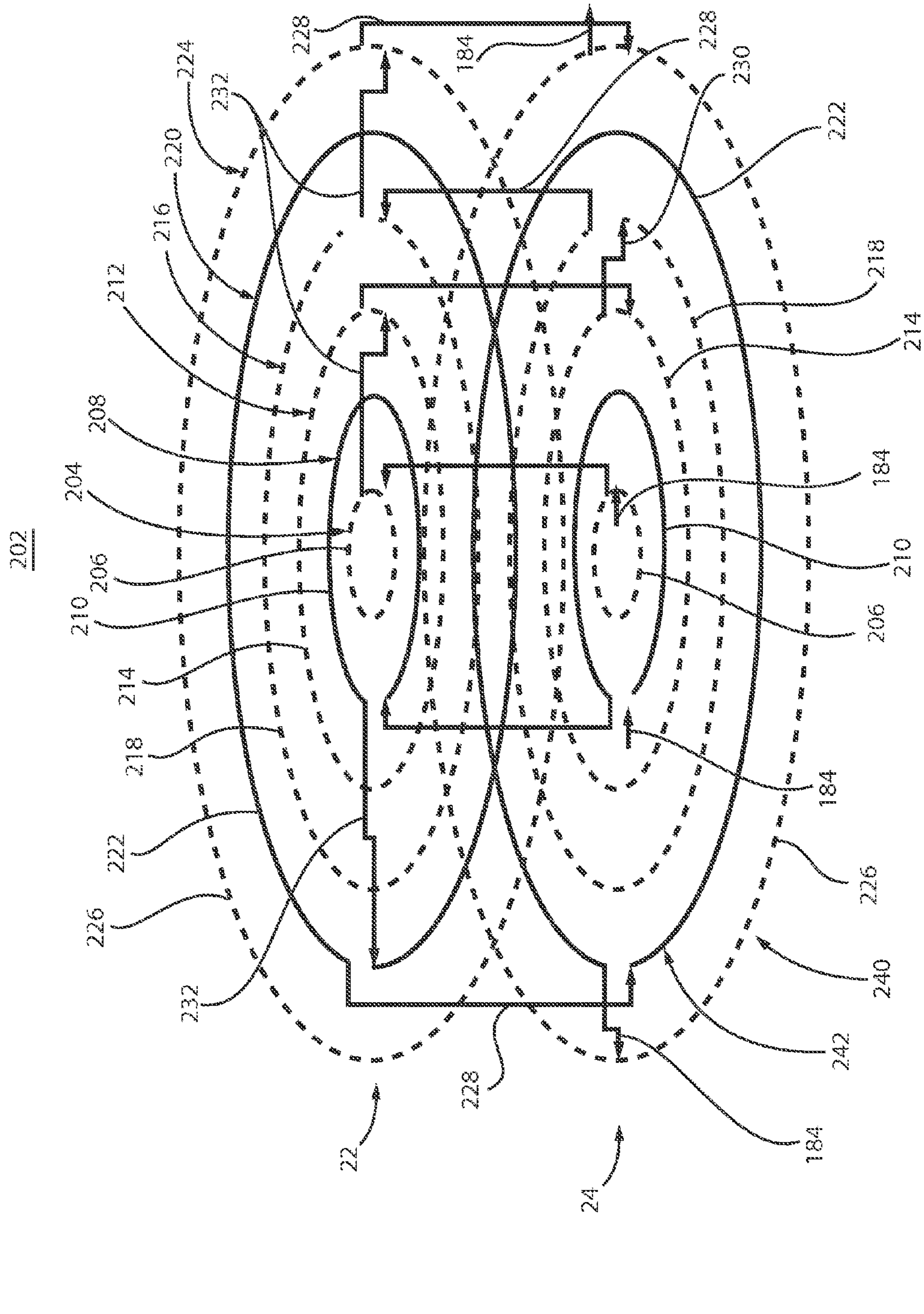
FIG. 10 is a three-dimensional schematic diagram of a transformer structure showing two spiral tracks connected through two levels for a high number of turns option in accordance with one embodiment.

Referring to FIG. 10, a high turns option transformer structure 202 is shown in accordance with one illustrative embodiment. The structure 202 includes two coils or spiral tracks 240 (shown in dashed lines) and 242 (shown in solid lines) disposed on multiple layers 22, 24 (either individual metal layers of conductor groups as previously described). The spiral track 240 includes turns 206, 214, 218, 226 on two levels (22, 24) for cylinders 204, 212, 216, and 224, respectively. The spiral track 242 includes turns 210, 222 on two levels (22, 24) for cylinders 208 and 220, respectively. In this embodiment, two consecutive cylinders 212 and 216 belong to the same coil or spiral track 240.

The turns 214 and 218 are connected by a connection 230. Connection 230 is a turn to turn connection within a same conductor group or metal layer without crossing another spiral track. Connection 230 may be made during a same process as the turns on that layer. The turns of each cylinder are connected using vias 228, as before. This provides a high n option a 2:1 turns ratio. It should be understood that the number of turns between portions of the spiral tracks can includes other numbers of turns, e.g., two or more as further shown in FIG. 11.

Figure 11:
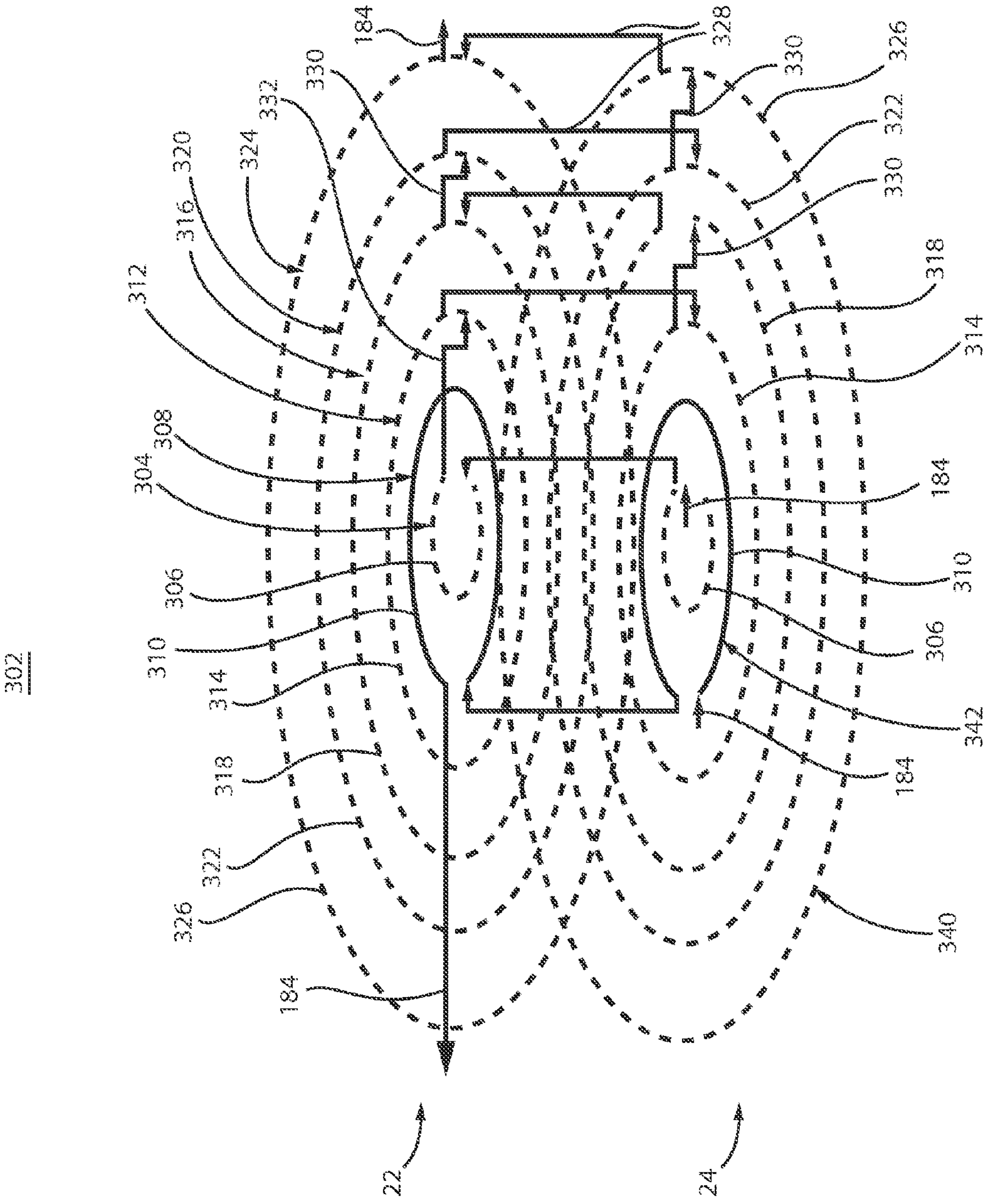
FIG. 11 is a three-dimensional schematic diagram of another transformer structure showing two spiral tracks connected through two levels for a higher number of turns option in accordance with another embodiment.

Referring to FIG. 11, another high turns option transformer structure 302 is shown in accordance with one illustrative embodiment. The structure 302 includes two coils or spiral tracks 340 (shown in dashed lines) and 342 (shown in solid lines) disposed on multiple layers 22, 24 (either individual metal layers of conductor groups as previously described). The spiral track 340 includes turns 306, 314, 318, 322, 326 on two levels (22, 24) for cylinders 304, 312, 316, 320 and 324, respectively. The spiral track 342 includes turns 310 on two levels (22, 24) for cylinder 308. In this embodiment, four consecutive cylinders 312, 316, 320 and 324 belong to the same coil or spiral track 340.

The turns 314, 318, 322 and 324 are connected by connections 330. Connections 330 are a turn to turn connection within a same conductor group or metal layer without crossing another spiral track. Connections 330 may be made during a same process as the turns on that layer. The turns of each cylinder are connected using vias 328, as before. Connection 332 connects the inner turns 306 to the outer turns 314, 318, 322 and 324 of the same spiral trace 340. This high n option maximizes the turns ratio. Other turns ratios can be achieved by varying the number of radius increments skipped between turns within a same conductor group in the first spiral track. It should be understood that the number of turns between portions of the spiral tracks can include other numbers of turns for either or both spiral tracks.

Figure 12:
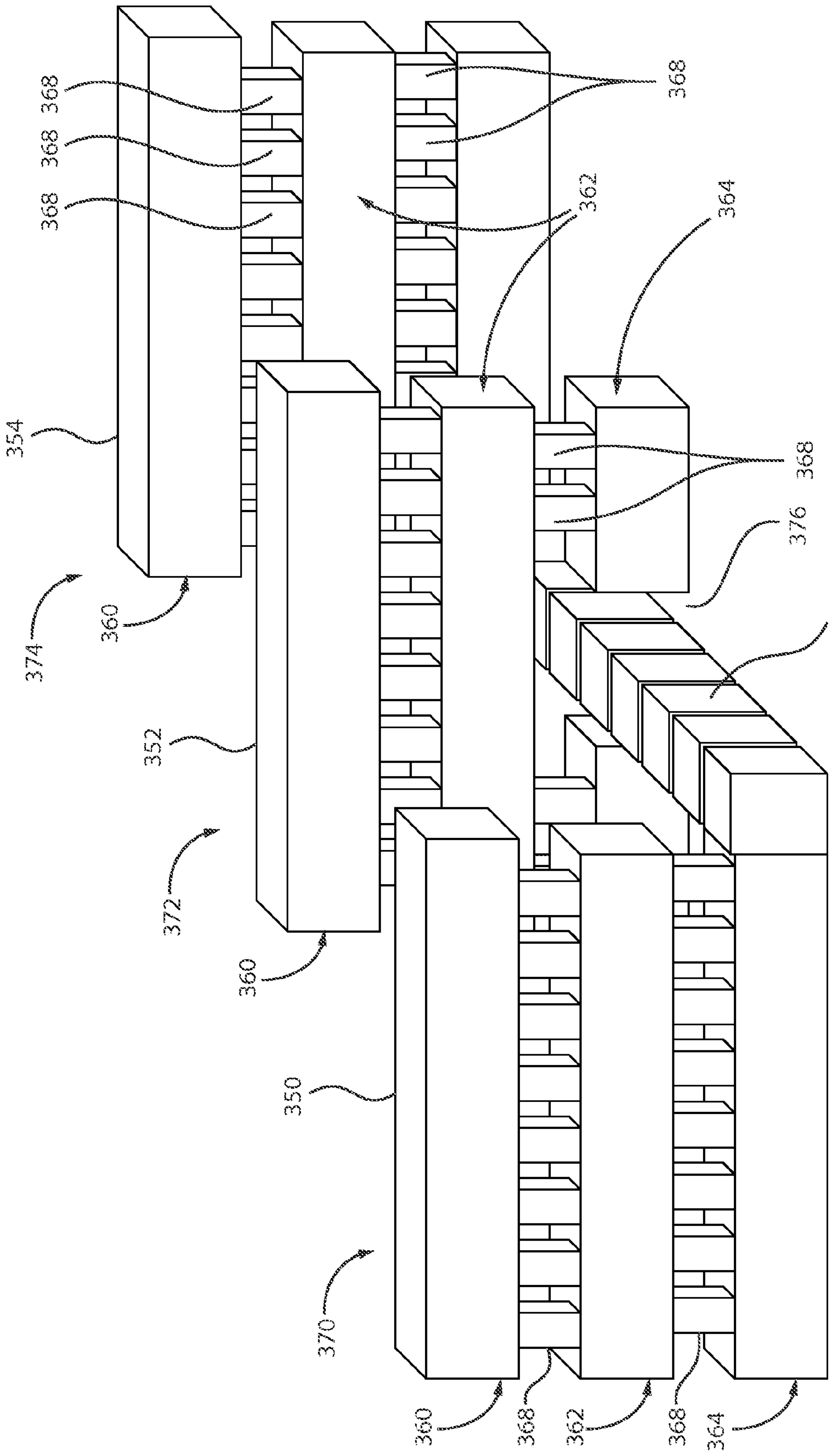
FIG. 12 is a three-dimensional diagram showing one method for connecting same spiral track turns through a different spiral track turn in accordance with one embodiment.

Referring to FIG. 12, one example of a turn to turn connection 332 made between turns 370 and 374 of a same spiral track across a turn 372 of a different spiral track is illustratively shown. In this embodiment, each turn 370, 372, 374 includes three metal layers 364, 362, 360 (e.g., M1, M2, M3 or other combinations of metal layers). The metal layers 364, 362, 360 are joined by vias 368 to form a conductor group for each spiral track. Since a connection is needed between turn 374 and turn 370, during patterning of metal layer 364 an opening 376 is formed to enable passage of the connection 332 through the turn 372 without breaking the turn 372. Other configurations may employ different metal layers to pass the connection through or other ways of avoiding breaking through a turn may be employed (e.g., going outside the turn diameter, etc.). Note that dielectric materials between turn 370, 372 and 374 as well as between vias 368 are not shown to permit viewing of the metal structures.

Figure 13:
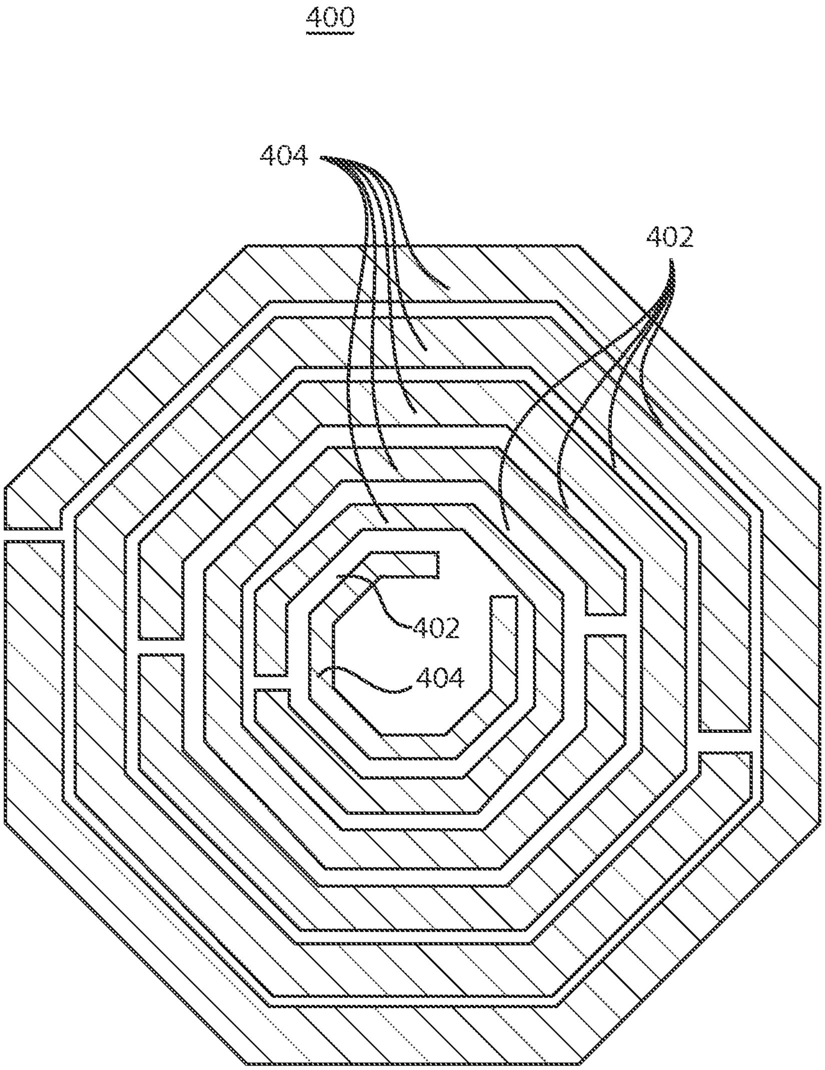
FIG. 13 is a plan view of a spiral employed for multiple spiral tracks and having reduced line thickness and increased spacing between the lines in accordance with one embodiment.

Referring to FIG. 13, the turns described for embodiments in accordance with the present principles may be modified to achieve different physical characteristics. FIG. 13 shows a spiral 400 having modified features. The spiral 400 may be a part of two or more spiral tracks and formed in a single metal layer, which may include, e.g., ferromagnetic or paramagnetic materials (Fe, Co, Ni, etc.). The spiral 400 may include smaller spacings 402 between lines 404 of turns with increasing radius and a larger cross-sectional dimension (width, thickness, diameter, etc.) of lines 404 with increasing radius. Wider, smaller space in outer turns and narrower, larger space in inner turns helps to minimize turn-turn capacitance and minimize eddy current losses. The turn-turn capacitance is reduced within primary and secondary coils and between primary and secondary coils to provide higher self-resonance frequencies, and increased bandwidth. Eddy current losses are also reduced in the inner turns, reducing power loss in the structure. Lower loss increases power transfer between the primary and secondary coils.

Width, thickness, diameter of the conductor or line 404 may be reduced at a constant rate or any other monotonic rate (including periodically constant) as winding toward the center of the coil. The space 402 between each consecutive turn may be increased at a constant rate or any other monotonic rate (including periodically constant) as winding toward the center of the coil. In one embodiment, the width of the primary/secondary turns can be made significantly different from the secondary/primary without disturbing the overall transformer structure. The line width and spacing at the top and bottom spirals can be different without altering the device structure. The top and bottom spirals can have a slight offset (e.g., within line width tolerance) instead of being perfectly aligned to the spiral above or below it. In addition, spacing 404 of primary/secondary intra turns can be reduced while increasing the primary and secondary inter turns to further enhance the high frequency performance.

Figure 14:
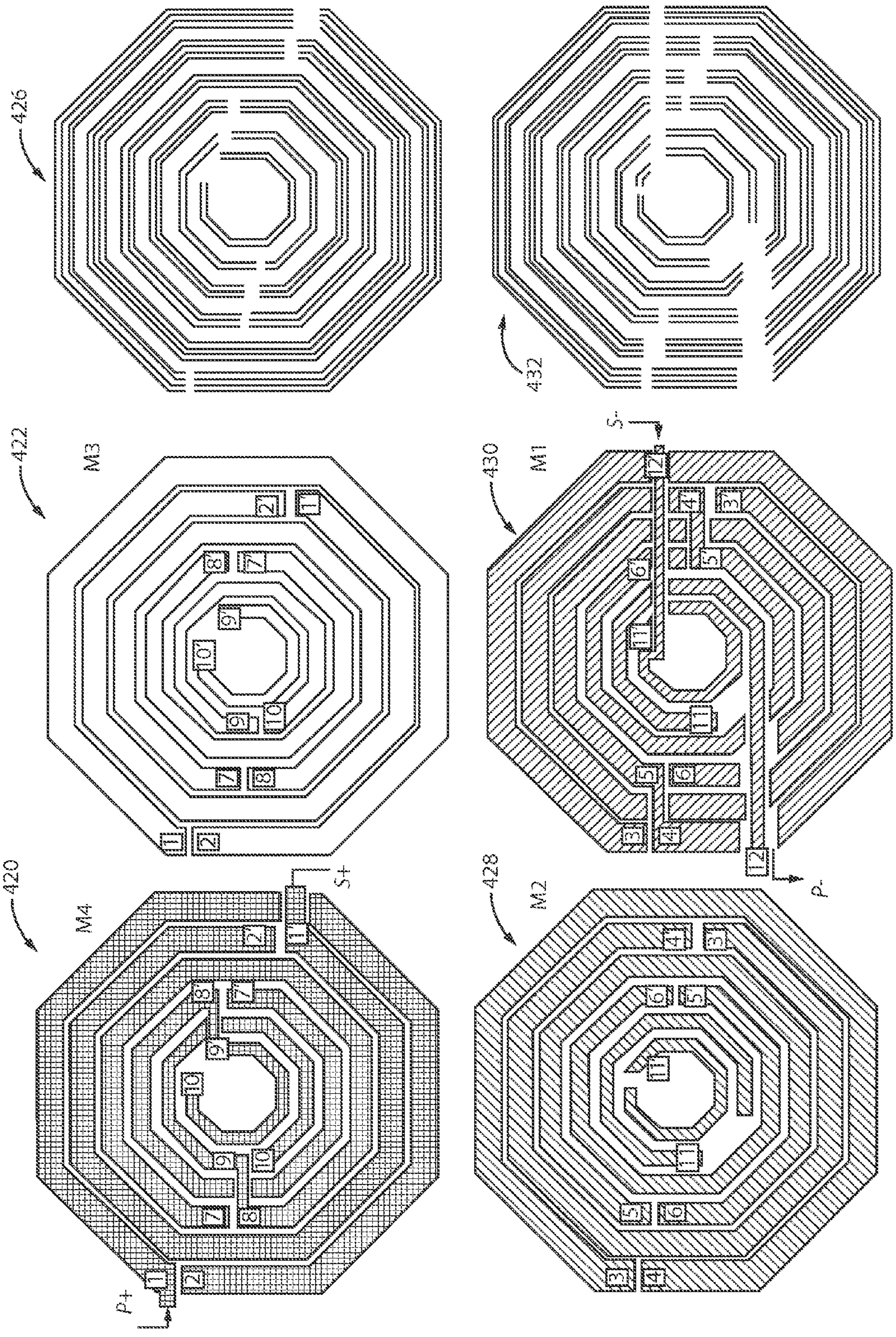
FIG. 14 is a plan view of spirals and via patterns to be connected in parallel layers and employed for multiple spiral tracks to form a transformer structure in accordance with one illustrative embodiment.

Referring to FIG. 14, spirals are depicted as employed in a plan view layout for an integrated circuit fabricated in accordance with the present principles. A top conductor group includes a spiral 420 (topmost) and spiral 422 on respective metal layers. A lower conductor group includes spirals 428 and 430 (lowermost) on respective metals layers. Connections between the spirals will be described using the numbers 1-12 and numbers 1'-12' in FIG. 14. A structure formed from the spirals includes the formation of a primary coil (e.g., with connections indicated as numbers 1-12 ) and a secondary coil (e.g., with connections indicated as numbers 1'-12'). The connections to the secondary coil are indicated by S+ and S−, and the connections to the primary coil are indicated by P+ and P−. A via pattern 426 is disposed vertically between spirals 420 and 422 to connect respective portions of the spirals, and a via pattern 432 is disposed vertically between spirals 428 and 430 to connect respective portions of the spirals.

The top spiral 420 is formed in a conductor group including two metal layers, e.g., M3 and M4, and begins at P+ to a point 1, wraps around, in a clockwise direction, to point 2 and then connects by a via to point 3 of spiral 428, which is formed in a conductor group including two metal layers, e.g., M1 and M2. The coil continues wrapping in a clockwise direction around to point 4 in layer M1/M2 and then connects over a turn to point 5 in the metal layer M1. The coil wraps around to point 6 (layers M1/M2) and then goes up again to layers M3/M4 at point 7 by a via. The coil wraps around again to point 8 in the M3/M4 layers, and connects to point 9 in layer M4 (through a turn). From point 9, the coil wraps around to point 10 and then back down to the M1/M2 layer at point 11. The coil wraps around again to point 12 or P−.

The secondary coil begins at S+ to a point 1', wraps around, in a clockwise direction, to point 2' and then connects by a via to point 3' in layers M1/M2 of spirals 428 and 430. The coil continues wrapping in a clockwise direction around to point 4' and, in layer M1, connects over a turn to point 5'. The coil wraps around to point 6' (layers M1/M2) and then goes up again to layers M3/M4 at point 7' by a via. The coil wraps around again to point 8' and in the M4 layer connects to point 9' through a turn. From point 9', the coil wraps around to point 10' and then back down to the M1/M2 layer at point 11'. The coil wraps around again to 12' or S−.

Referring to FIGS. 15-18, cross-sectional diagrams show current flow through a number of different transformer structures in accordance with the present principles. The transformer structures are depicted as cross-sections of two or three layer structures using arrows to depict current flow laterally and boxes at the cross-section of the turns with a symbol of either a solid dark circle or a circle with an "X" through it. The solid dark circle indicates current out of the page, and the circle with an "X" through it indicates current into the page. Turns belonging to different spiral tracks are designated as darker boxes versus lighter boxes.

As described above, each spiral track includes two or more turns electrically connected together in series. Each turn within a spiral track is comprised of a single conductor group and configured in such a way that it has a "start" connection and an "end" connection. Within a spiral track each turn may be constructed either from the same conductor group as other turns in the spiral track or from a different conductor group. The turns making up the spiral track form a continuous series connection from the "external start connection" to the "external end connection", with the resulting net current path always traveling in either a clockwise or a counter-clockwise direction around the axial centerline of the spiral track. A first turn within a spiral track has a "start" connection that is the spiral track's "external start connection". A last turn within a spiral track has an "end" connection that is the spiral track's "external end connection". Each series connected, turn within the spiral track makes an electrical connection between its "end" connection and the "start" connection of the next turn. This electrical connection from one turn's "end" connection to the next turn's "start" connection may occur laterally within the same conductor group, or it may occur vertically using a via from one conductor group to another.

Figure 15:
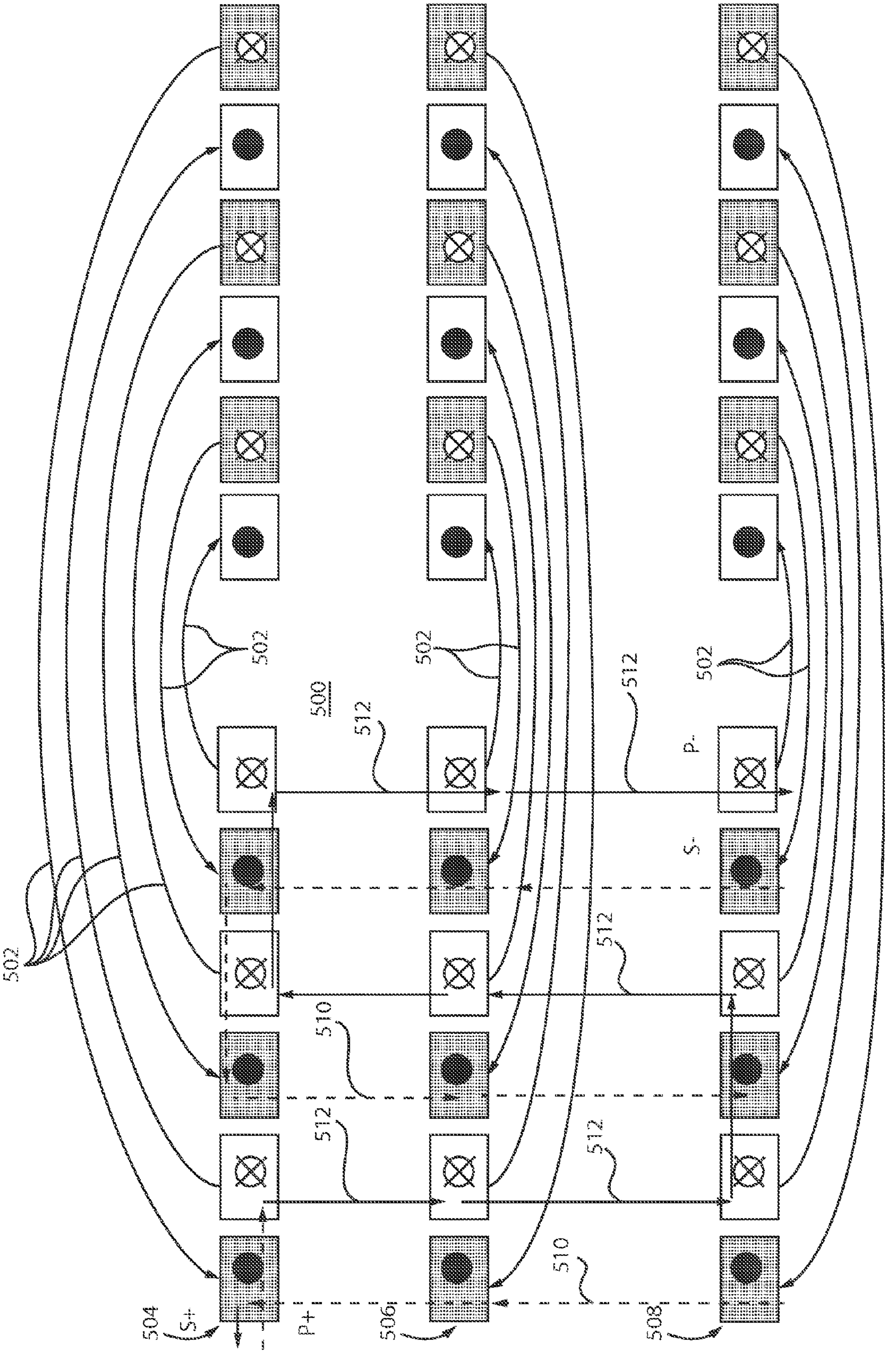
FIG. 15 is a diagram showing current flow through the center cross-section of the structure of FIG. 2 in accordance with one embodiment.

Referring to FIG. 15, a transformer structure 500 includes three levels 504, 506 and 508, which may include individual metal layers or conductor groups (multiple metal layers). Each level includes a mixture of primary (P− to P+) and secondary (S+ to S−) spiral tracks. Current flows for the structure of FIG. 2 through turns 502 in a general direction as indicated by arrows 510 for the secondary (dashed lines and 512 for the primary (solid lines) and arrows on the turns 502. It should be noted that the primary and secondary designations can be reversed. Also, voltage polarities are illustratively shown as +'s and −'s, but may be reversed as needed.

Figure 16:
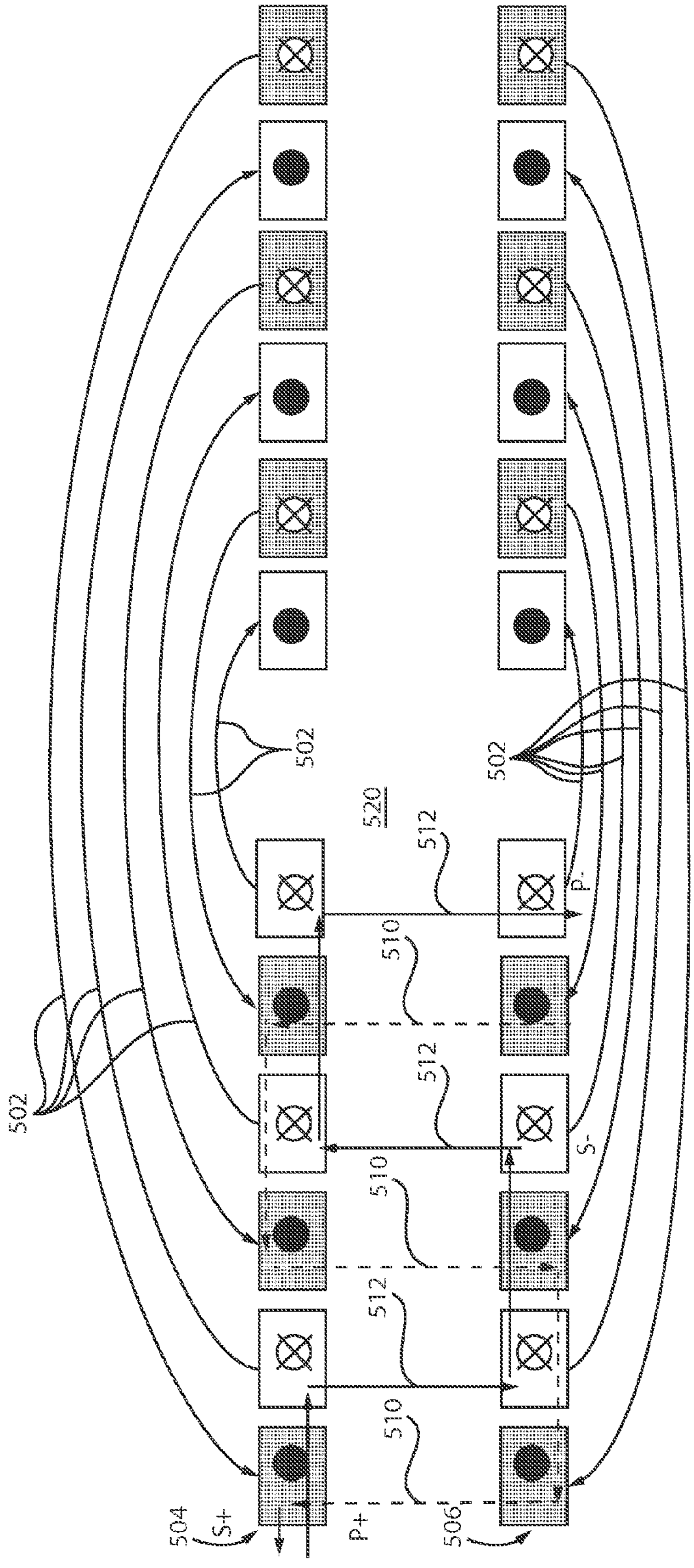
FIG. 16 is a diagram showing current flow through the center cross-section of the structure of FIG. 3 in accordance with one embodiment.

Referring to FIG. 16, a transformer structure 520 includes two levels 504 and 506, which may include individual metal layers or conductor groups (multiple metal layers). Each level includes a mixture of primary (P− to P+) and secondary (S+ to S−) spiral tracks. Current flows for the structure of FIG. 3 are shown through turns 502 in a general direction as indicated by arrows 510 for the secondary (dashed lines and 512 for the primary (solid lines) and arrows on the turns 502. It should be noted that the primary and secondary designations can be reversed. Also, voltage polarities are illustratively shown as +'s and −'s, but may be reversed as needed.

Figure 17:
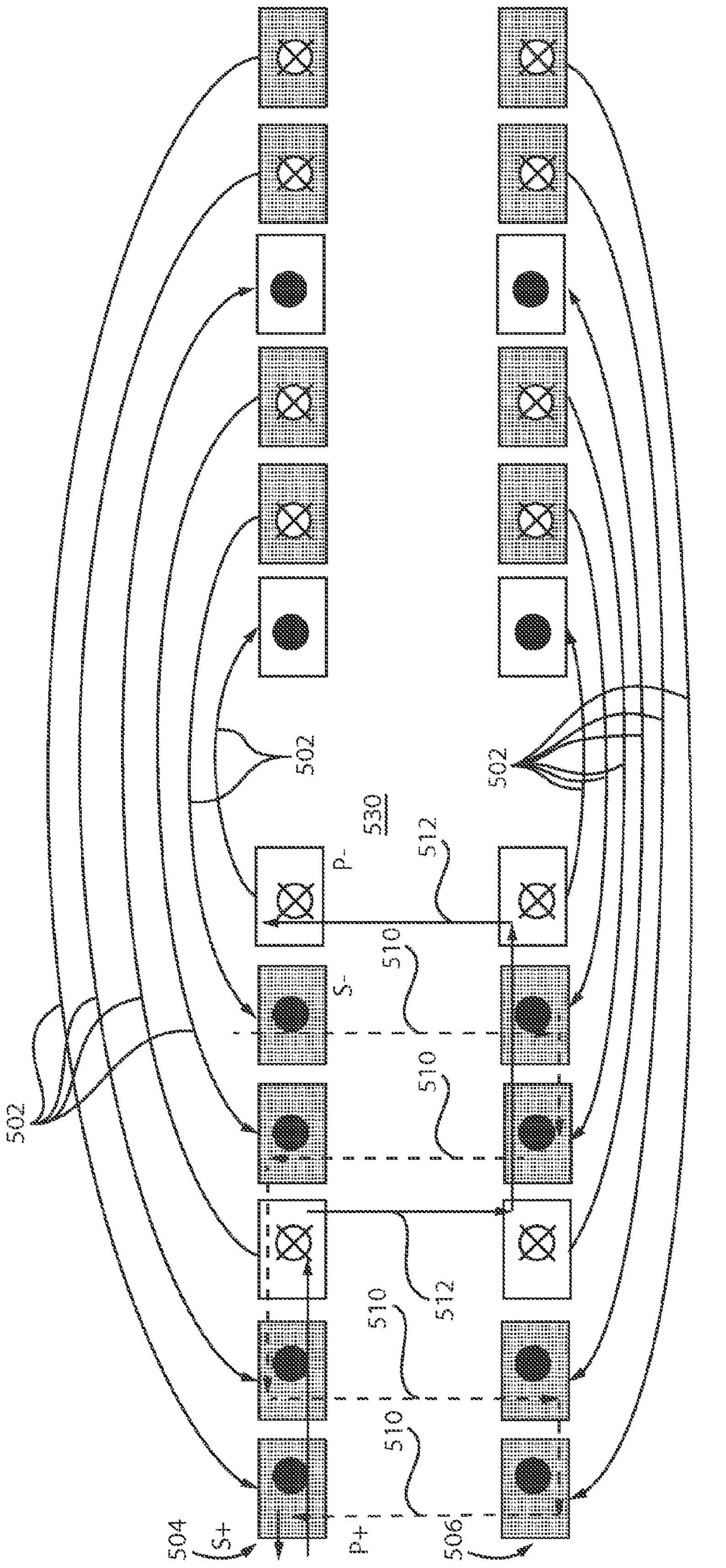
FIG. 17 is a diagram showing current flow through the center cross-section of the structure of FIG. 10 in accordance with one embodiment.

Referring to FIG. 17, a transformer structure 530 includes two levels 504 and 506, which may include individual metal layers or conductor groups (multiple metal layers) for a high turn ratio embodiment. Each level includes a mixture of primary (P− to P+) and secondary (S+ to S−) spiral tracks. Current flows for the structure of FIG. 10 is shown through turns 502 in a general direction as indicated by arrows 510 for the secondary (dashed lines and 512 for the primary (solid lines) and arrows on the turns 502. It should be noted that the primary and secondary designations can be reversed. Also, voltage polarities are illustratively shown as +'s and −'s, but may be reversed as needed.

Figure 18:
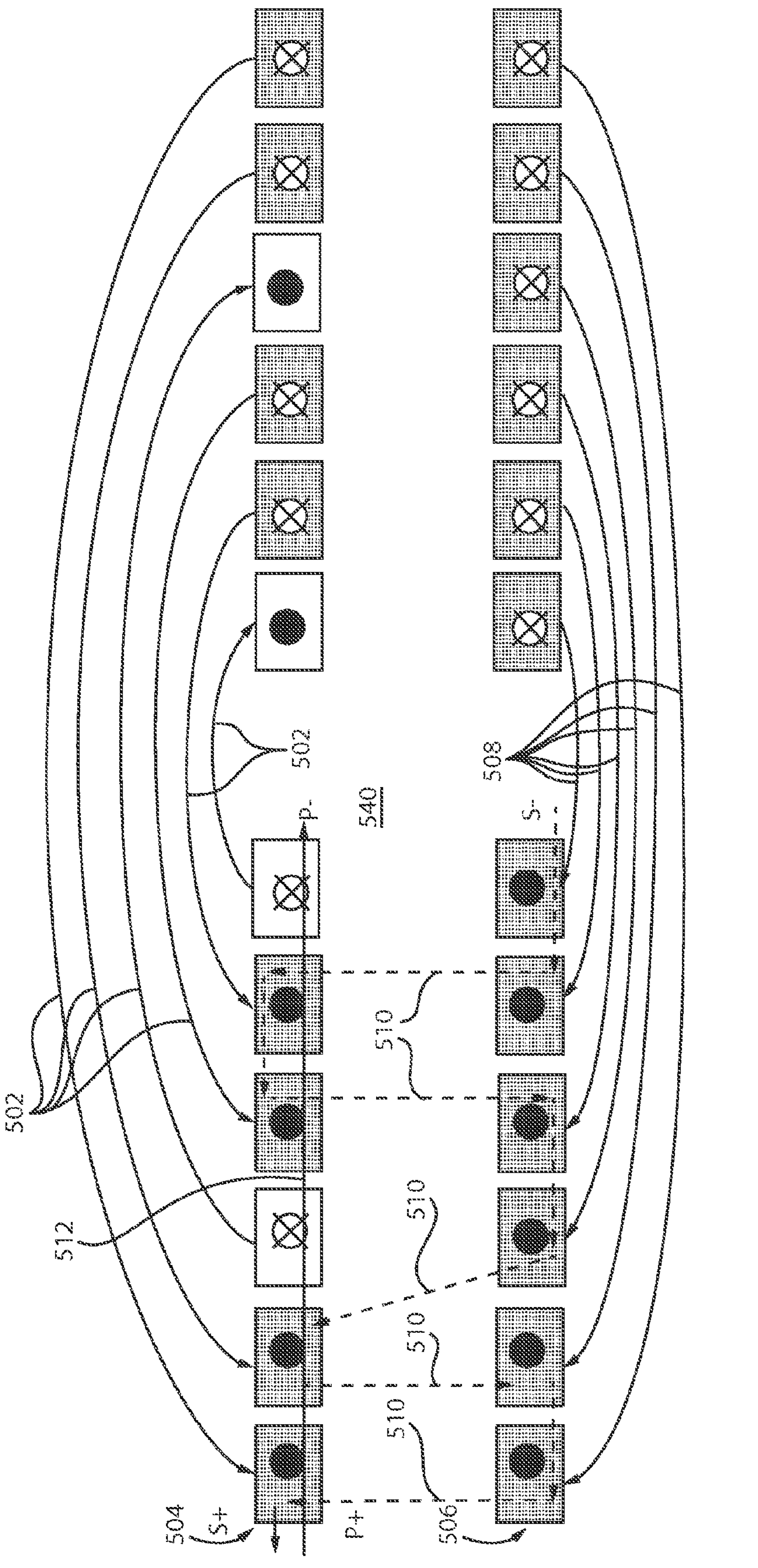
FIG. 18 is a diagram showing current flow for the structure of FIG. 11 in accordance with one embodiment.

Referring to FIG. 18, a transformer structure 540 includes two levels 504 and 506, which may include individual metal layers or conductor groups (multiple metal layers) for a high turn ratio embodiment. Each level includes a mixture of primary (P− to P+) and secondary (S+ to S−) spiral tracks. Current flows for the structure of FIG. 11 is shown through turns 502 in a general direction as indicated by arrows 510 for the secondary (dashed lines and 512 for the primary (solid lines) and arrows on the turns 502. It should be noted that the primary and secondary designations can be reversed. Also, voltage polarities are illustratively shown as +'s and −'s, but may be reversed as needed.

Simulation data comparing the configuration of FIG. 3 (present structure) with a design having spiral primary coil disposed between two spiral coils making up a secondary coil (comparison structure) provided an 8-50% improvement achieved in power gain between 2.4 GHz and 6 GHz. A 0.4-5 dB reduction in insertion loss is achieved between 800 MHz and 3 GHz. Except for a slight reduction in K the present structure outperformed the comparison structure in all metrics (e.g., inductance, etc.).

In accordance with the present embodiments, the disclosed devices provide the unique feature of easily tailoring the turns ratio. For example, by increasing the secondary inductance and reducing the primary inductance the turn ratio can be increased. The inductance can be changed by employing geometric changes and/or the number of consecutive turns within a spiral track for a given coil (primary or secondary). The 3D wiring and structures of the transformers in accordance with the present principles enhance high frequency performance with the following features: high inductance density, high Q for both primary and secondary (low insertion loss), higher turns ratio (impedance transformation ratio), suitability for high power applications, etc.

Having described preferred embodiments for high efficiency on-chip 3D transformer structures (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An integrated circuit transformer structure, comprising:

at least two conductor groups stacked in parallel in different layers;

a first spiral track formed in the at least two conductor groups, the first spiral track including:

first turns of a first radius within each of the at least two conductor groups, and second turns of a second radius within each of the at least two conductor groups, the first and second turns being electrically connected; and a second spiral track formed in the at least two conductor groups, the second spiral track including a plurality of adjacent turns of one or more radii within each of the at least two conductor groups and disposed in a same plane between the first and second turns in each of the at least two conductor groups.

2. The structure as recited in claim 1, wherein the plurality of adjacent turns of one or more radii includes one of two turns and four turns.

3. The structure as recited in claim 1, wherein at least one of the first turns and the second turns includes a plurality of adjacent turns of one or more radii within each of the at least two conductor groups and disposed in a same plane between turns of the second spiral track.

4. The structure as recited in claim 1, wherein the at least two conductor groups each include one or more metal layers.

5. The structure as recited in claim 1, wherein at least one conductor group includes two or more metal layers connected by vias.

6. The structure as recited in claim 1, wherein one of the first spiral track and the second spiral track includes a primary transformer coil and the other of the first spiral track and the second spiral track includes a secondary transformer coil.

7. The structure recited in claim 1, wherein one of the first turns is electrically connected to one of the second turns through a connection that is electrically isolated from one of the plurality of adjacent turns.

8. The structure as recited in claim 1, wherein the at least two conductor groups include spirals having a line winding about a central axis and the line has a cross-sectional line dimension reduced at a rate as winding toward the center axis.

9. The structure as recited in claim 1, wherein the at least two conductor groups include spirals having spaces between a line winding about a central axis and the spaces are increased at a rate as winding toward the center axis.

10. The structure as recited in claim 1, wherein the at least two conductor groups include spirals having at least one of different line widths and different line spacings between spirals on different layers.

11. The structure as recited in claim 1, wherein the at least two conductor groups each include spirals offset relative one another.

* * * * *